(12) United States Patent
Yoshitani et al.

(10) Patent No.: US 7,852,608 B2
(45) Date of Patent: Dec. 14, 2010

(54) ELECTROSTATIC DISCHARGE PROTECTION CIRCUIT AND SEMICONDUCTOR DEVICE

(75) Inventors: Masanori Yoshitani, Kawasaki (JP); Tetsuya Hayashi, Kawasaki (JP); Tomokazu Higuchi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 107 days.

(21) Appl. No.: 11/882,865

(22) Filed: Aug. 6, 2007

(65) Prior Publication Data

US 2008/0043390 A1  Feb. 21, 2008

(30) Foreign Application Priority Data

Aug. 15, 2006  (JP) .............................. 2006-221669

(51) Int. Cl.
*H02H 9/04* (2006.01)
(52) U.S. Cl. ...................................................... 361/56
(58) Field of Classification Search .................... 361/56
See application file for complete search history.

(56) References Cited

U.S. PATENT DOCUMENTS

| | | | | |
|---|---|---|---|---|
| 5,515,232 | A | * | 5/1996 | Fukazawa et al. ........... 361/111 |
| 2001/0043449 | A1 | * | 11/2001 | Okushima ..................... 361/56 |
| 2006/0114047 | A1 | * | 6/2006 | Irino ........................... 327/328 |
| 2006/0125514 | A1 | * | 6/2006 | Hashimoto .................... 326/21 |

OTHER PUBLICATIONS

Patent Abstract of Japan, Japanese Publication No. 09-036245, Published Feb. 7, 1997.
Patent Abstract of Japan, Japanese Publication No. 2006-121007, Published May 11, 2006.
Patent Abstract of Japan, Japanese Publication No. 11-220031, Published Aug. 10, 1999.
Patent Abstract of Japan, Japanese Publication No. 2002-314516, Published Oct. 25, 2002.
Patent Abstract of Japan, Japanese Publication No. 2005-285160, Published Oct. 13, 2005.
Patent Abstract of Japan, Japanese Publication No. 2004-336800, Published Nov. 25, 2004.

* cited by examiner

*Primary Examiner*—Jared J Fureman
*Assistant Examiner*—Nicholas Ieva
(74) *Attorney, Agent, or Firm*—Fujitsu Patent Center

(57) ABSTRACT

An electrostatic discharge protection circuit and a semiconductor device that prevent the breakdown of a semiconductor device caused by an electrostatic discharge (ESD) which suddenly changes. When voltage which is far higher than VDD1 is applied to a power supply line as a result of an ESD, a great electric potential difference is produced between VDD1 and VSS. At this time an electric current path for making an electric charge generated by overvoltage flow to a grounding line is formed by a clamp circuit. As a result, an electric current flows into GND of a circuit block. This prevents the production of a great electric potential difference between VDD1 and VSS. In addition, at this time a rapid change in the level of the overvoltage applied to a signal line is suppressed by a protection circuit. This prevents the dielectric breakdown of gate oxide films of transistors included in a circuit block which receives a control signal.

5 Claims, 12 Drawing Sheets

ELECTROSTATIC DISCHARGE PROTECTION CIRCUIT AND SEMICONDUCTOR DEVICE

CROSS-REFERENCE TO RELATED APPLICATIONS

This application is based upon and claims the benefits of priority from the prior Japanese Patent Application No. 2006-221669, filed on Aug. 15, 2006, the entire contents of which are incorporated herein by reference.

BACKGROUND (1) Field

This invention relates to an electrostatic discharge protection circuit and a semiconductor device and, more particularly, to an electrostatic discharge protection circuit and a semiconductor device for protecting an internal circuit against overvoltage added to power supply voltage due to an electrostatic discharge.

(2) Description of the Related Art

For example, gate oxide film layers of transistors have become thinner with the progress of microfabrication technology. Accordingly, the employment of measures to prevent the breakdown of semiconductor devices caused by electrostatic discharge (ESD) has become an important subject.

An ESD protection circuit for protecting an element against ESD will now be described. FIG. 10 is a circuit diagram showing an example of an ESD protection circuit included in a conventional semiconductor device.

In this example, circuit blocks 910 and 920 to which electric power is supplied from different power supplies are located over the same semiconductor substrate. In the circuit block 910 a clamp circuit 911 for protecting an internal circuit is located between the power supply the electric potential of which is VDD1 and ground (GND) the electric potential of which is VSS. Similarly, in the circuit block 920 a clamp circuit 921 is located between the power supply the electric potential of which is VDD2 and the GND the electric potential of which is VSS.

It is assumed that a control signal used for controlling the circuit block 920 is sent via a signal line 940 as a signal outputted from the circuit block 910 to the circuit block 920. If a fixed signal is outputted as the control signal, the control signal may be fixed at a high level (electric potential of the power supply) or a low level (electric potential of the GND). In this example, the control signal is fixed at the high level.

When voltage which is far higher than ordinary voltage is applied in this state as VDD1 as a result of an ESD, an electric current path a is formed by the clamp circuit 911. An electric current flows along the electric current path a and into the GND. This prevents the production of a great electric potential difference between VDD1 and VSS and therefore prevents the dielectric breakdown of gate oxide films of two input transistors included in the circuit block 920.

A semiconductor circuit device which includes a plurality of protection circuits according to power supply system and which discharges static electricity that collects in a package to an externally connected terminal via a protection circuit is proposed (see, for example, Japanese Unexamined Patent Publication No. 9-36245 (FIG. 1)).

By the way, electrostatic discharge failure models include a machine model (MM), a human body model (HBM), and a charged device model (CDM). Studies on the MM and the HBM are advancing. For example, in the case of the MM and the HBM, standards for resistance to electrostatic discharge failure are conventionally set. A high level of breakdown voltage can be maintained by using the conventional ESD protection circuit shown in FIG. 10. In the case of the CDM, however, a high level of breakdown voltage cannot always be maintained by using the conventional ESD protection circuit because, for example, a guarantee of breakdown voltage has not been required up to recently.

The characteristics of these models, together with test circuits which simulate the models, will now be described. FIGS. 11A and 11B are views showing the rough structure of the test circuits which simulate the electrostatic discharge failure models. FIG. 11A shows the rough structure of the test circuit which simulates the MM and the HBM. FIG. 11B shows the rough structure of the test circuit which simulates the CDM.

In the case of the MM, an electric discharge occurs when a charged metal machine (robot, for example) that handles a device touches a device terminal. In the case of the HBM, an electric discharge occurs when a person's charged body directly touches a semiconductor device.

As shown in FIG. 11A, a condenser discharge method is used for simulating failures which occur in the MM and the HBM. With the condenser discharge method, an electric charge is held in a condenser C the capacitance of which corresponds to that of the person's body or the metal machine, and the electric charge held in the condenser C is discharged to a device (DUT in FIG. 11A) 950 via a resistor R by switching a relay. In the MM an electric charge collects in a metal object, so the discharge capacitance of the condenser C and the discharge resistance of the resistor R are set to, for example, 200 pF and 0Ω respectively. In the HBM an electric charge collects in a person's body, so the discharge capacitance of the condenser C and the discharge resistance of the resistor R are set to, for example, 100 pF, which corresponds to the capacitance of a person's body, and 1.5 kΩ, which corresponds to the resistance of a person's skin, respectively.

In the CDM a device itself is charged by, for example, friction with an automatic transportation machine or the like or dielectric charging from a charged object. When the charged device touches a tester, a jig, or a tool, an electric discharge occurs. As shown in FIG. 11B, a device charging method is used for simulating a failure which occurs in the CDM. With the device charging method, a DUT 950 is charged by connecting it to a power supply. An electric charge held in the DUT 950 is discharged via a resistor R the discharge resistance of which is 1Ω by switching a relay.

Compared with the MM and the HBM simulated by the condenser discharge method, the electric charge discharged flows in a very short period of time in the CDM. This is a characteristic of the CDM. The influence of these electrostatic discharge failure models on the conventional ESD protection circuit will be described.

The conventional ESD protection circuit (clamp circuit) shown in FIG. 10 prevents an ESD from generating overvoltage between VDD1 and VSS. However, at this time an electric current flows in the ESD protection circuit, resulting in IR drop (fall in voltage) caused by the ESD protection circuit.

Each of FIGS. 12A, 12B, and 12C is a view showing the waveform of a control signal in the conventional ESD protection circuit at the time of the occurrence of an ESD. FIG. 12A is a view showing the waveform of a control signal in the conventional ESD protection circuit in the case of the MM. FIG. 12B is a view showing the waveform of a control signal in the conventional ESD protection circuit in the case of the HBM. FIG. 12C is a view showing the waveform of a control signal in the conventional ESD protection circuit in the case of the CDM.

The control signal is received by the circuit block 920. In the case of the MM and the HBM shown in FIGS. 12A and 12B respectively, the control signals are comparatively wide pulse signals and their pulse widths are, for example, of the order of some tens of nanometers. Accordingly, voltage applied to the circuit block 920 does not exceed the breakdown voltage of gate oxide films. As a result, electrostatic discharge failure can be prevented fully by using the conventional ESD protection circuit.

In the case of the CDM shown in FIG. 12C, however, the control signal is a pulse signal having a very great slope. The pulse width of this control signal is about one hundredth of that of the pulse signal in the case of the MM shown in FIG. 12A. An electric current flows in a very short period of time in the CDM. Therefore, the amount of the electric current is not so large, but a peak electric current becomes powerful. As a result, there is a significant change in the voltage of the control signal. Voltage applied to the transistors included in the circuit block 920 which receives the control signal exceeds the breakdown voltage of the gate oxide films. A gate oxide film of a MOS device is thin and is about several to 100 nm thick. Therefore, when voltage higher than the breakdown voltage is applied, the gate oxide film breaks down. As a result, a dielectric breakdown of the gate oxide films of the input transistors included in the circuit block 920 which receives the control signal occurs in the CDM.

That is to say, with the conventional ESD protection circuit and semiconductor device it is difficult to prevent the breakdown of a semiconductor device caused by an electrostatic discharge in the CDM in which a pulse signal having a very great slope flows.

In addition, with the semiconductor circuit device disclosed in Japanese Unexamined Patent Publication No. 9-36245, an electric charge that collects in the package is discharged to the externally connected terminal via one of the ESD protection circuits included according to power supply system. In this case, however, the ESD protection circuits must always be connected to the externally connected terminal. This is not desirable.

SUMMARY

The present embodiment was made under the background circumstances described above. In particular, an object of the present embodiment is to provide an ESD protection circuit and a semiconductor device that can prevent the breakdown of the semiconductor device caused by a high-frequency electrostatic discharge.

DESCRIPTION OF THE PREFERRED EMBODIMENTS

In order to achieve the above object, an electrostatic discharge protection circuit for protecting an internal circuit against overvoltage added to power supply voltage due to an electrostatic discharge is provided. This electrostatic discharge protection circuit comprises a first protection circuit including a clamp circuit for clamping the overvoltage by forming an electric current path and making an electric charge generated by the overvoltage flow to a grounding line at the time of the overvoltage being applied to a power supply line in one of circuit blocks which belong to different power supply systems and a second protection circuit located on a signal line by which a predetermined signal is sent between circuit blocks connected by the first protection circuit for suppressing a signal level increase caused by the addition of the overvoltage generated due to the electrostatic discharge to the predetermined signal sent via the signal line.

In addition, in order to achieve the above object, there is provided a semiconductor device having a plurality of circuit blocks which belong to different power supply systems and each of which has an electrostatic discharge protection circuit for protecting an internal circuit against overvoltage added to power supply voltage due to an electrostatic discharge. This semiconductor device comprises a first protection circuit including a clamp circuit for clamping the overvoltage by forming an electric current path and making an electric charge generated by the overvoltage flow to a grounding line at the time of the overvoltage being applied to a power supply line in one of the plurality of circuit blocks and a second protection circuit located on a signal line by which a predetermined signal is sent between circuit blocks connected by the first protection circuit for suppressing a signal level increase caused by the addition of the overvoltage generated due to the electrostatic discharge to the predetermined signal sent via the signal line.

The above and other objects, features and advantages of the present invention will become apparent from the following description when taken in conjunction with the accompanying drawings which illustrate preferred embodiments of the present embodiment by way of example.

Embodiments will now be described with reference to the drawings.

Figure 1:
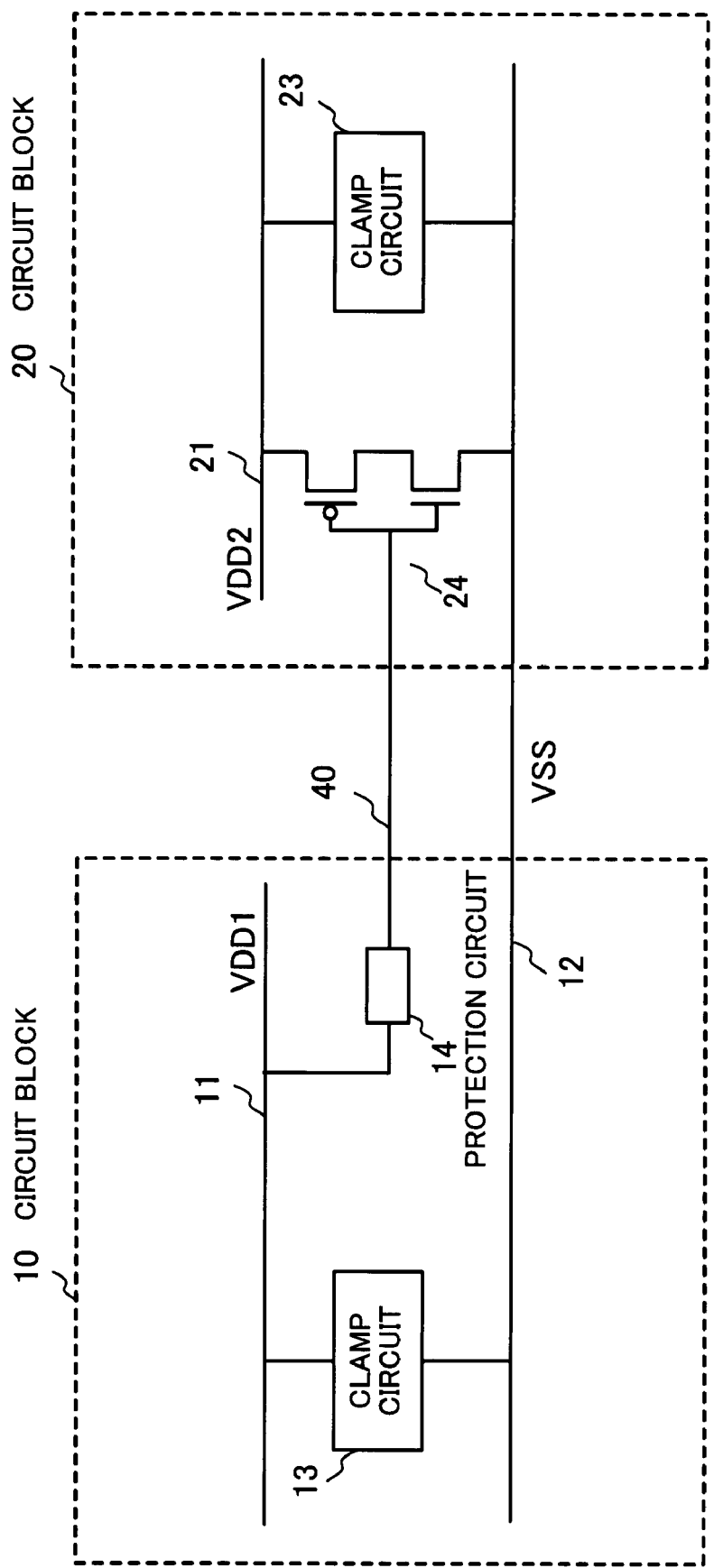
FIG. 1 is a circuit diagram showing a protection circuit applied to embodiments of the present invention.

FIG. 1 is a circuit diagram showing a protection circuit applied to embodiments.

A semiconductor device according to the present embodiment comprises a plurality of circuit blocks to which electric power is supplied from different power supplies. In FIG. 1, a circuit block (output side) 10 and a circuit block (input side) 20 included in the circuit block group are shown. A control signal is sent from the circuit block (output side) 10 to the circuit block (input side) 20 via a signal line 40. In addition, the circuit blocks 10 and 20 are connected by a common grounding line 12.

The circuit block 10 which sends the control signal includes a clamp circuit 13 which is connected to a power supply line 11 and the grounding line 12 and a protection circuit 14 which is located on the signal line 40 and which is connected to the power supply line 11. It is assumed that power supply voltage applied to the power supply line 11 is VDD1 and that the voltage of the grounding line 12 is VSS. The clamp circuit 13 is connected in series between a power supply the potential of which is VDD1 and ground (GND) the potential of which is VSS. When VDD1 becomes higher than ordinary voltage as a result of an ESD, an electric current path along which an electric charge generated by overvoltage is made to flow to the GND is formed. The protection circuit 14 is made up of elements having resistance components by which a sharp increase in the level of an input signal is suppressed. Accordingly, a resistor, a diode, a transistor, a buffer, or the like is used as the protection circuit 14.

The circuit block 20 which receives the control signal includes a clamp circuit 23 which is connected to a power supply line 21 and the grounding line 12 and a transistor pair 24 connected to the signal line 40. It is assumed that power supply voltage applied to the power supply line 21 is VDD2. The clamp circuit 23 is the same as the clamp circuit 13.

There are cases where a fixed signal is sent from the circuit block 10 to the circuit block 20 via the signal line 40 as the control signal. In such cases, the control signal is fixed frequently at the high level (electric potential of the power supply) or the low level (electric potential of the GND). In this example, the control signal is fixed at the high level.

The case where overvoltage is generated on the power supply line 11 in the semiconductor device having the above circuit structure as a result of an ESD will now be described. VSS is considered as a basis (GND).

The electric potential of VSS is the GND. When voltage which is far higher than VDD1 is applied to the power supply line 11 as a result of the ESD, a great electric potential difference is produced between VDD1 and VSS. At this time the clamp circuit 13 goes into the on state and an electric current path which connects the power supply line 11 and the grounding line 12 is formed. While the electric current path exists, an electric current flows into the GND of the circuit block 10. This prevents the production of a great electric potential difference between VDD1 and VSS.

Moreover, when overvoltage suddenly changes in, for example, the CDM and an electric current the peak value of which is high suddenly flows into the protection circuit 14 connected to the signal line 40 in a short period of time, the protection circuit 14 functions to drop the peak value of the electric current. As a result, a rapid change in the control signal in, for example, the CDM is suppressed and the peak of voltage applied to the transistor pair 24 included in the circuit block 20 which receives the control signal becomes lower than the breakdown voltage of each gate oxide film of the transistor pair 24. This prevents the production of a great electric potential difference between VDD1 and VSS and the dielectric breakdown of the gate oxide films of the input transistor pair 24 included in the circuit block 20.

After that, when the overvoltage applied to the power supply line 11 disappears, the clamp circuit 13 goes into the off state and the electric current path formed disappears.

Figure 2:
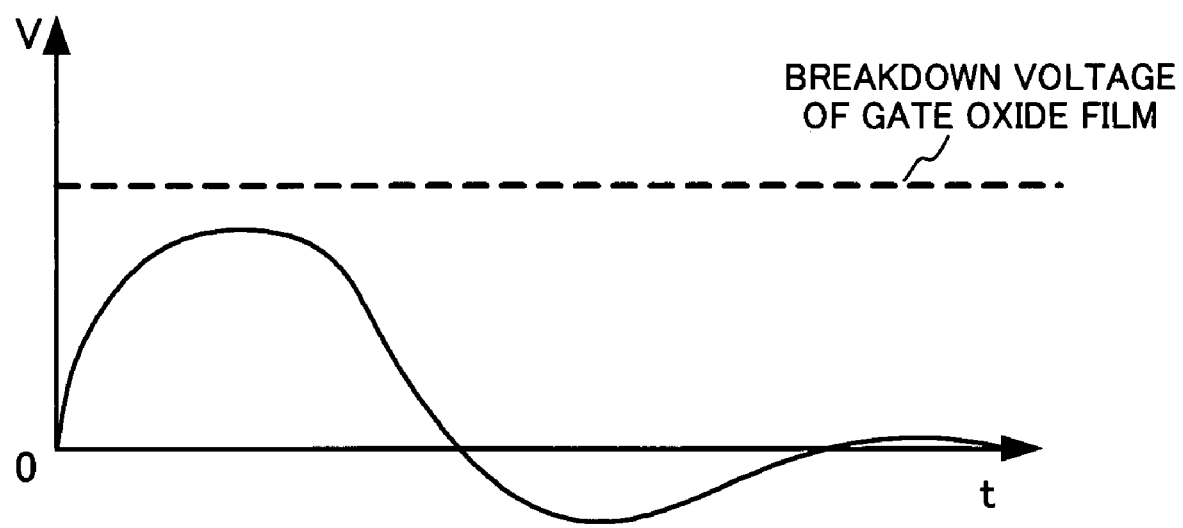
FIG. 2 is a view showing the waveform of a control signal outputted from a protection circuit according to the present invention at the time of the occurrence of an ESD.

FIG. 2 is a view showing the waveform of the control signal outputted from the protection circuit according to the present embodiment at the time of the occurrence of an ESD.

Figure 12A:
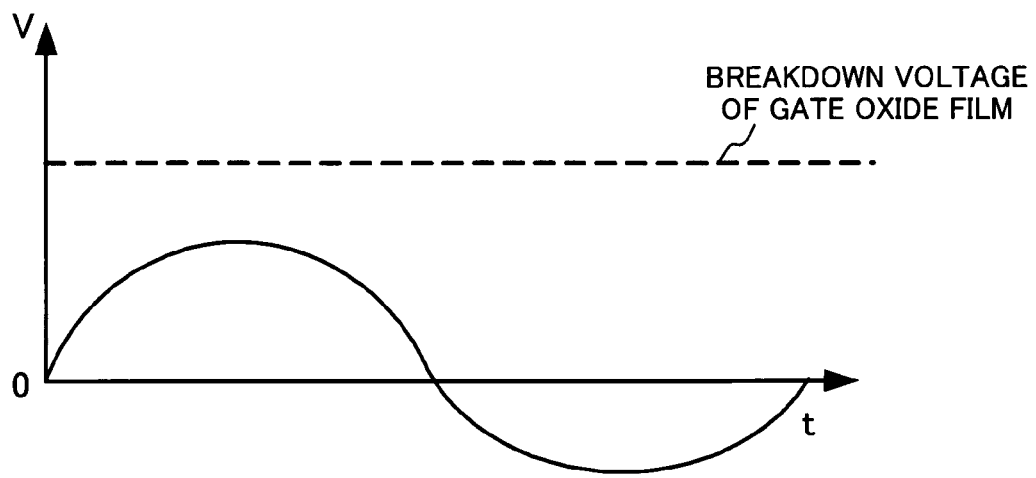
FIGS. 12A, 12B, and 12C are views showing the waveforms of control signals in the conventional ESD protection circuit at the time of the occurrence of an ESD.
Figure 12B:
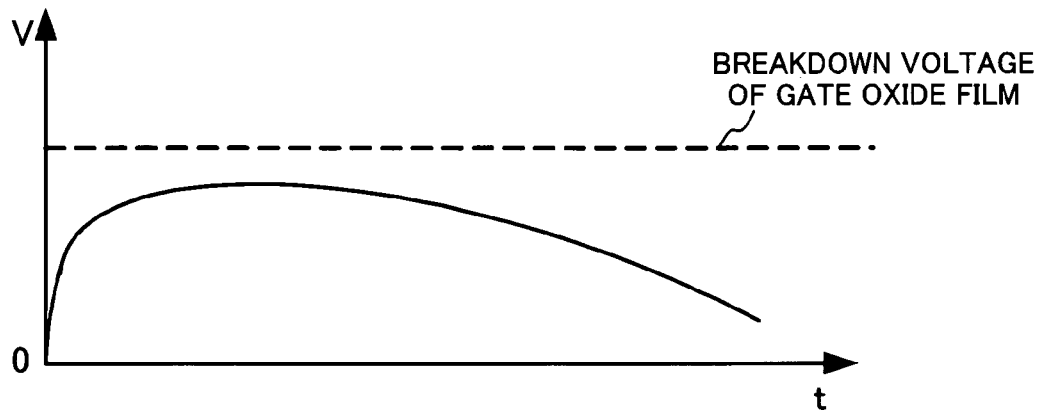
Figure 12C:
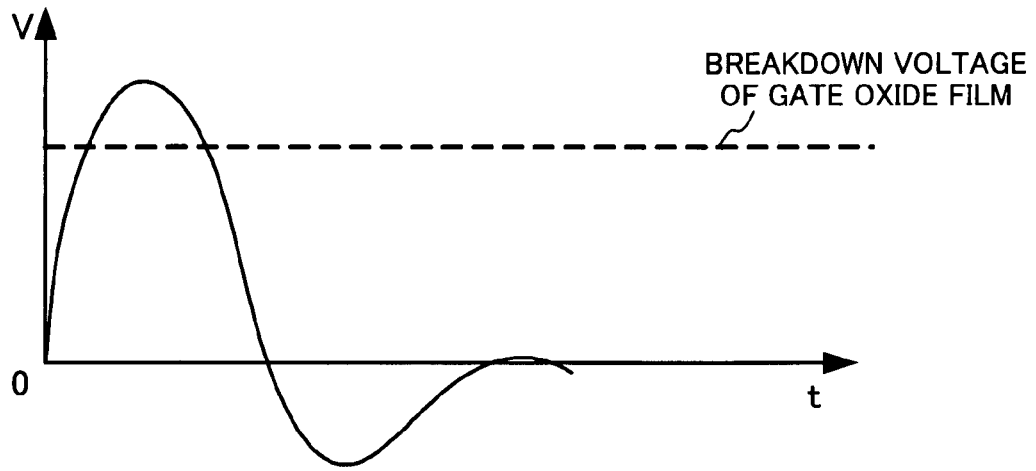

Compared with the conventional signal waveforms which are shown in FIG. 12 and which are obtained in the case of not using the protection circuit 14, the slope of the waveform of the control signal outputted to the circuit block 20 via the protection circuit 14 is gentle. That is to say, the peak value of the overvoltage is lower than the breakdown voltage level of the gate oxide films of the transistors included in the circuit block 20 which receives the control signal. An electric charge suddenly flows in, for example, the CDM. When such a phenomenon simulated by, for example, the CDM occurs, the peak value of voltage applied to the transistor pair 24 included in the circuit block 20 can be made lower than the breakdown voltage of the gate oxide films of the transistor pair 24.

As has been described, in the embodiments the protection circuit 14 which is effective against a high-frequency ESD simulated by the CDM is incorporated into the ESD protection circuit including the clamp circuits 13 and 23 which are effective against ESDs simulated by the MM and the HBM. The protection circuit 14 is a delay element having a resistance component and suppresses a change in waveform that occurs in a short period of time on the signal line 40 via which the control signal is sent from the circuit block 10 to the circuit block 20. This prevents an overvoltage waveform which is generated by an ESD in the CDM or the like and which changes markedly from appearing in the control signal sent from the circuit block 10 to the circuit block 20 via the signal line 40.

As stated above, in the embodiments it may be possible to improve breakdown voltage against a high-frequency ESD simulated by the CDM without deteriorating breakdown voltage against ESDs simulated by the MM and the HBM. In addition, the embodiments can be realized only by locating the additional protection circuit on the signal line. Accordingly, the protection circuit can be formed easily and circuit area does not increase.

The structure of circuits according to the embodiments will now be described in order.

Figure 3:
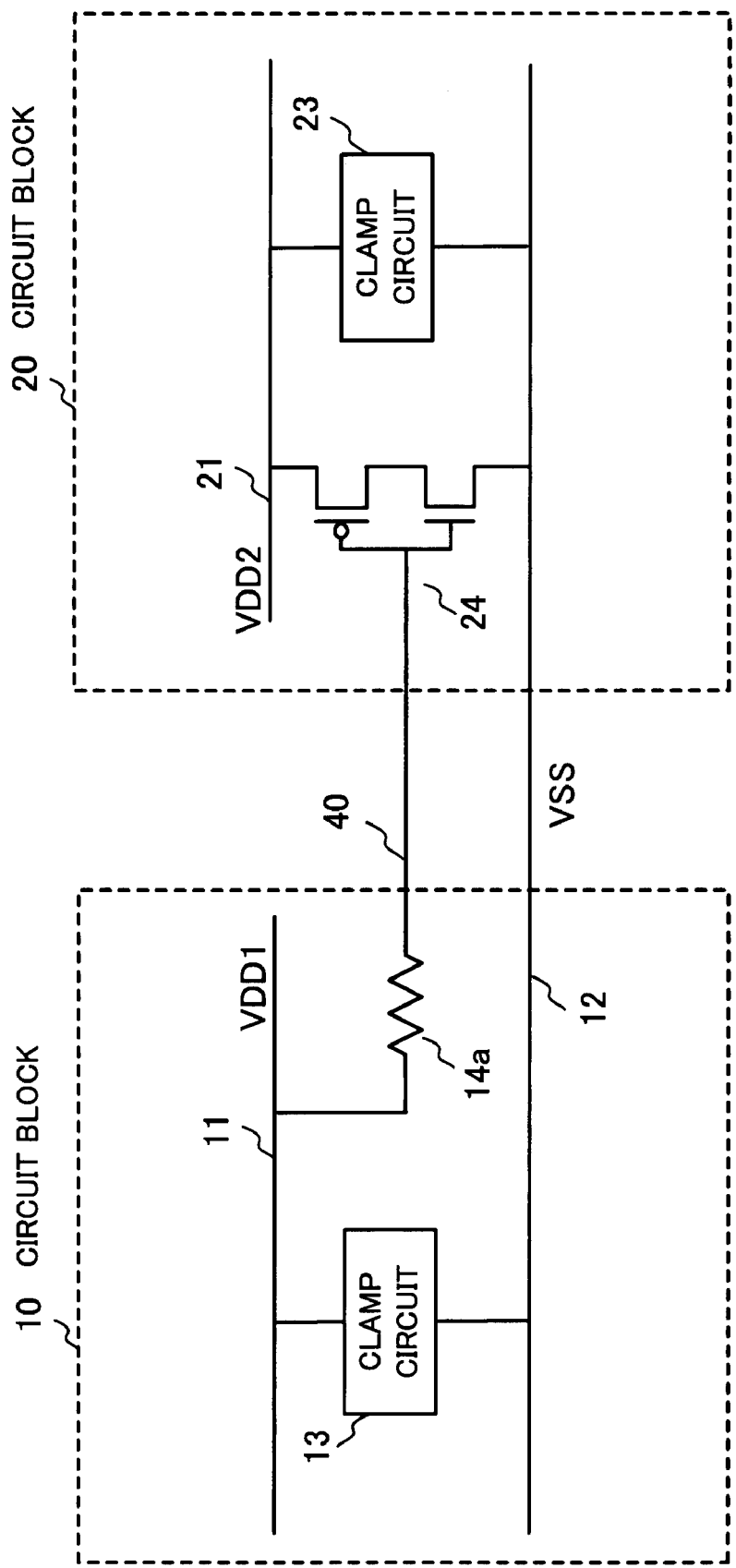
FIG. 3 is a view showing the structure of a circuit according to a first embodiment of the present invention.

FIG. 3 is a view showing the structure of a circuit according to a first embodiment. Components in FIG. 3 that are the same as those shown in FIG. 1 are marked with the same symbols and descriptions of them will be omitted.

In the first embodiment a resistor 14a is used as a protection circuit. When high-frequency overvoltage generated due to a CDM is applied via a power supply line 11, the resistor 14a makes it possible to bring the peak value of an electric current down and to make the slope of a control signal waveform gentler than that of the conventional control signal waveform. As a result, peak voltage applied to a transistor pair 24 included in a circuit block 20 which receives the control signal can be decreased and gate oxide films can be protected.

Figure 4:
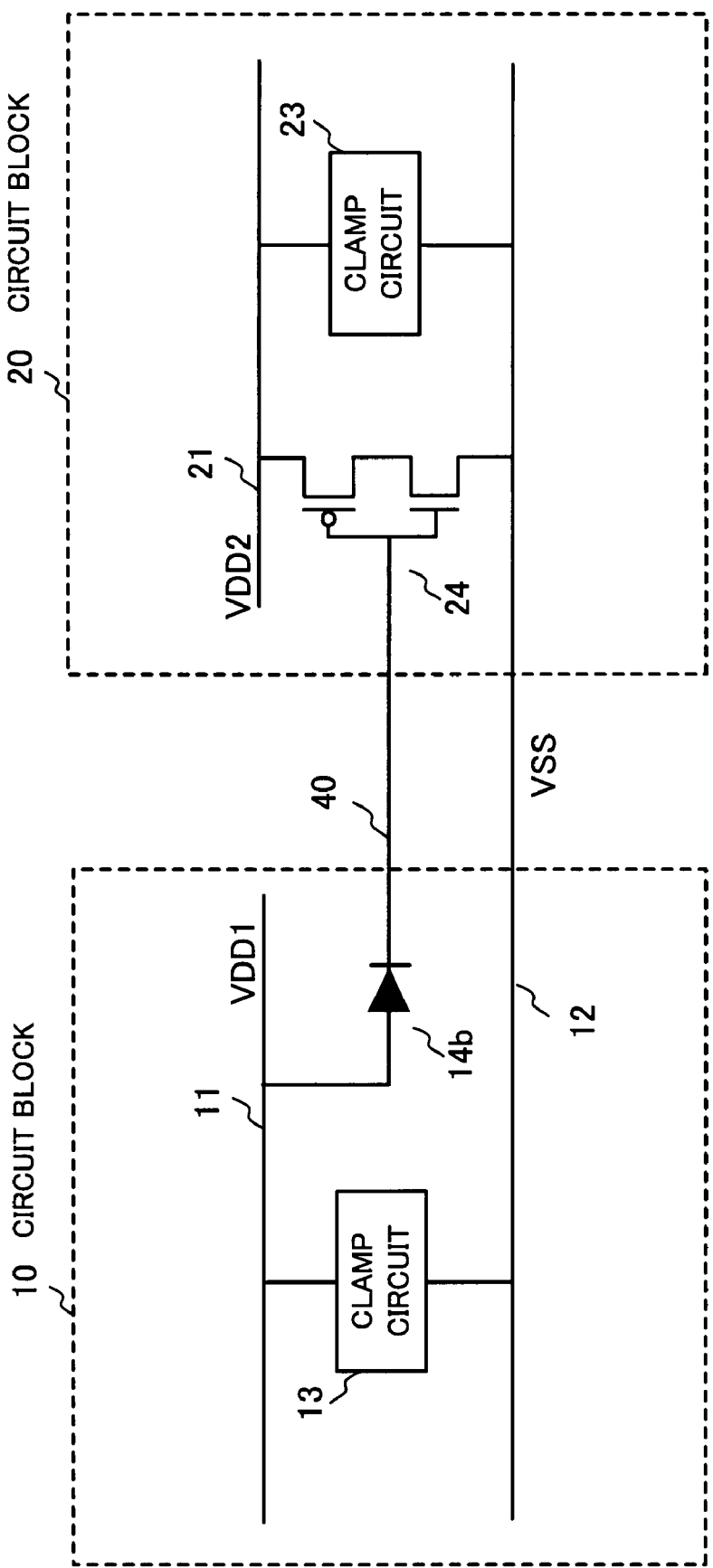
FIG. 4 is a view showing the structure of a circuit according to a second embodiment of the present invention.

FIG. 4 is a view showing the structure of a circuit according to a second embodiment of the present embodiment. Components in FIG. 4 that are the same as those shown in FIG. 1 are marked with the same symbols and descriptions of them will be omitted.

In the second embodiment of the present embodiment a diode 14b is used as a protection circuit.

An anode of the diode 14b is connected to VDD1 and a cathode of the diode 14b is connected to a transistor pair 24 included in a circuit block 20. When overvoltage generated due to a CDM is applied to a power supply line 11, a forward bias is applied between the anode and the cathode. At this time a resistance component the diode 14b has functions the same as the resistor 14a. That is to say, the resistance component of the diode 14b brings the peak electric current value of a control signal down and protects gate oxide films of transistors included in a circuit block 20 which receives the control signal.

Figure 5:
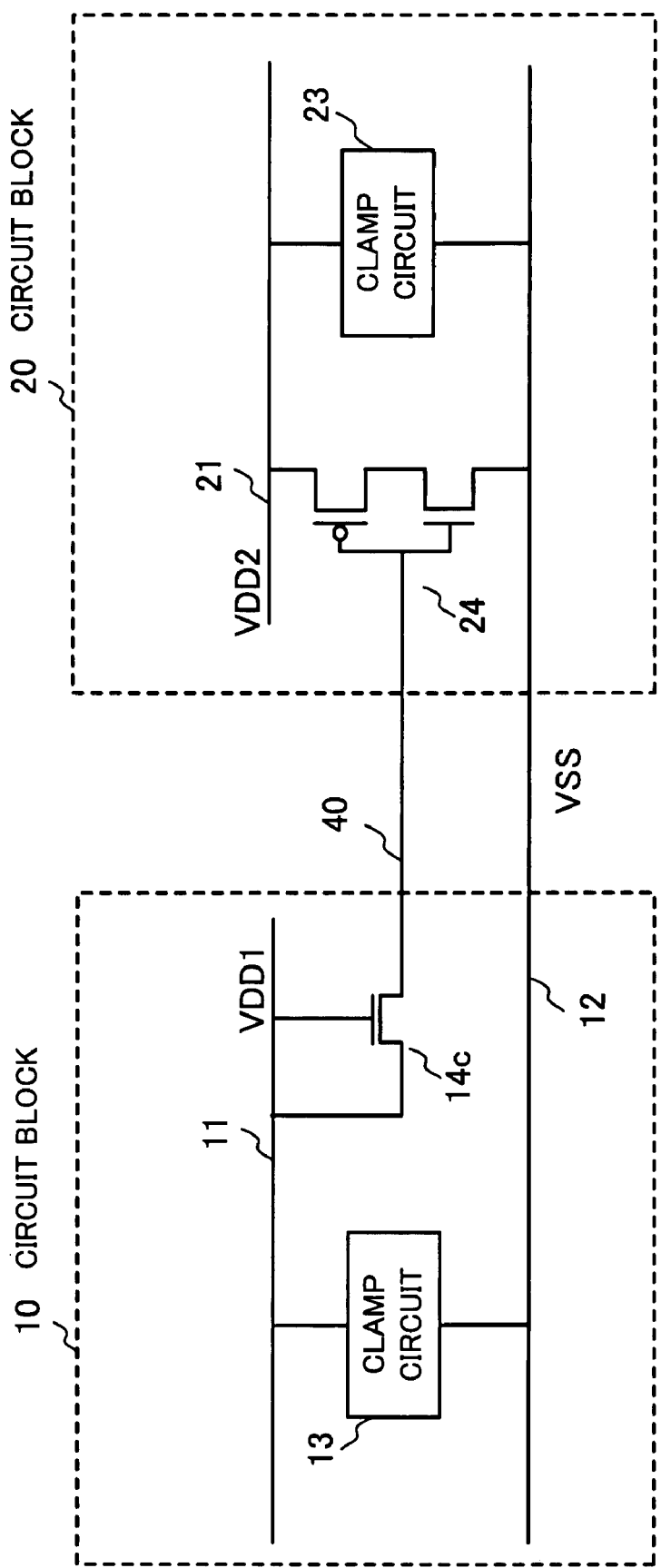
FIG. 5 is a view showing the structure of a circuit according to a third embodiment of the present invention.

FIG. 5 is a view showing the structure of a circuit according to a third embodiment. Components in FIG. 5 that are the same as those shown in FIG. 1 are marked with the same symbols and descriptions of them will be omitted.

In the third embodiment a transistor 14c is used as a protection circuit. A gate of the transistor 14c is connected to a power supply line 11 and a control signal is sent via the transistor 14c. When overvoltage generated due to a CDM is applied to the power supply line 11, a resistance component the transistor 14c has functions the same as the resistor 14a. That is to say, the resistance component of the transistor 14c brings the peak electric current value of a control signal down and protects gate oxide films of transistors included in a circuit block 20 which receives the control signal.

Figure 6:
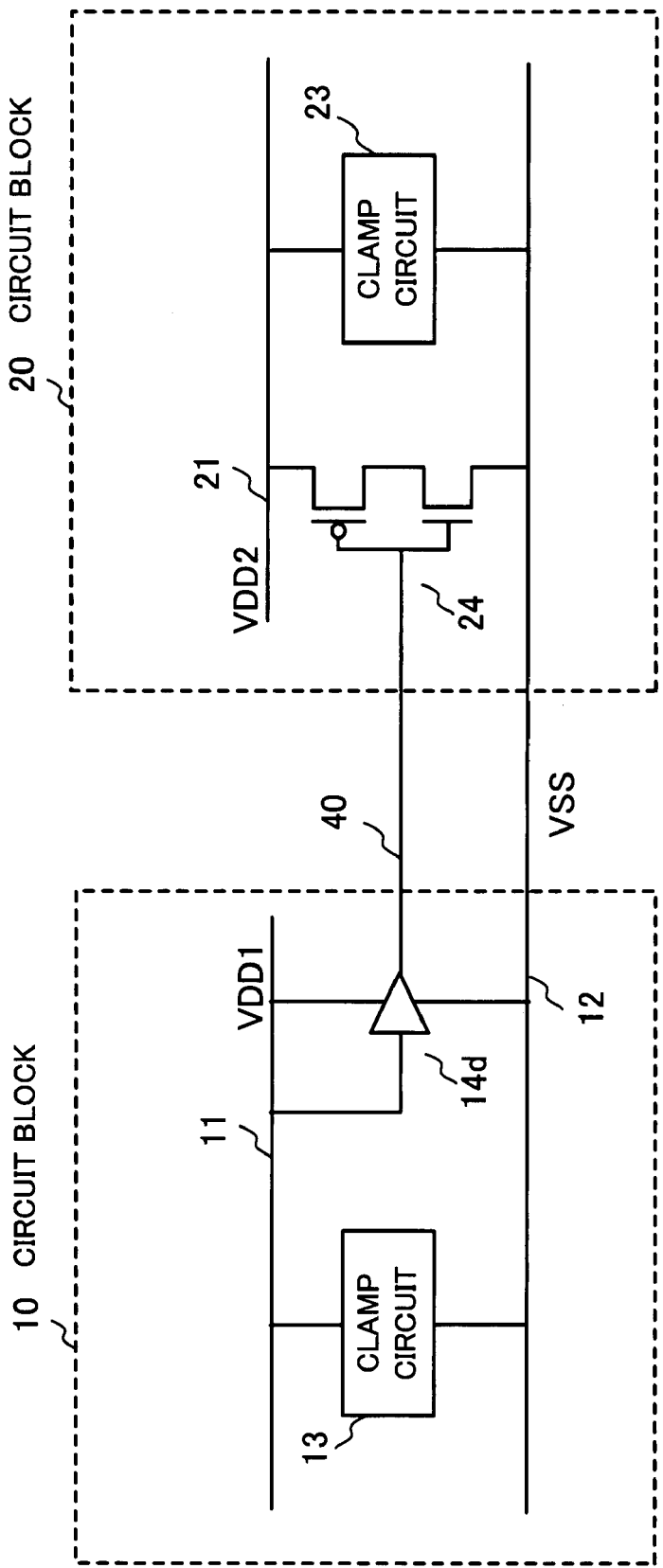
FIG. 6 is a view showing the structure of a circuit according to a fourth embodiment of the present invention.

FIG. 6 is a view showing the structure of a circuit according to a fourth embodiment. Components in FIG. 6 that are the same as those shown in FIG. 1 are marked with the same symbols and descriptions of them will be omitted.

In the fourth embodiment a buffer 14d is used as a protection circuit.

The buffer 14d functions as a buffer amplifier and outputs a control signal inputted in its original condition. When overvoltage generated due to a CDM is applied to a power supply line 11, a resistance component the buffer 14d has functions the same as the resistor 14a. That is to say, the resistance component of the buffer 14d brings the peak electric current value of the control signal down and protects gate oxide films of transistors included in a circuit block 20 which receives the control signal.

As stated above, each of the ESD protection circuits according to the embodiments can protect an internal circuit, particularly the gate oxide films of the transistors included in the circuit block 20 which receives the control signal against overvoltage which is simulated by the CDM and which is applied in a very short period of time.

The present invention is not limited to the above embodiments. Any element may be used in an ESD protection circuit having the same function.

Figure 7:
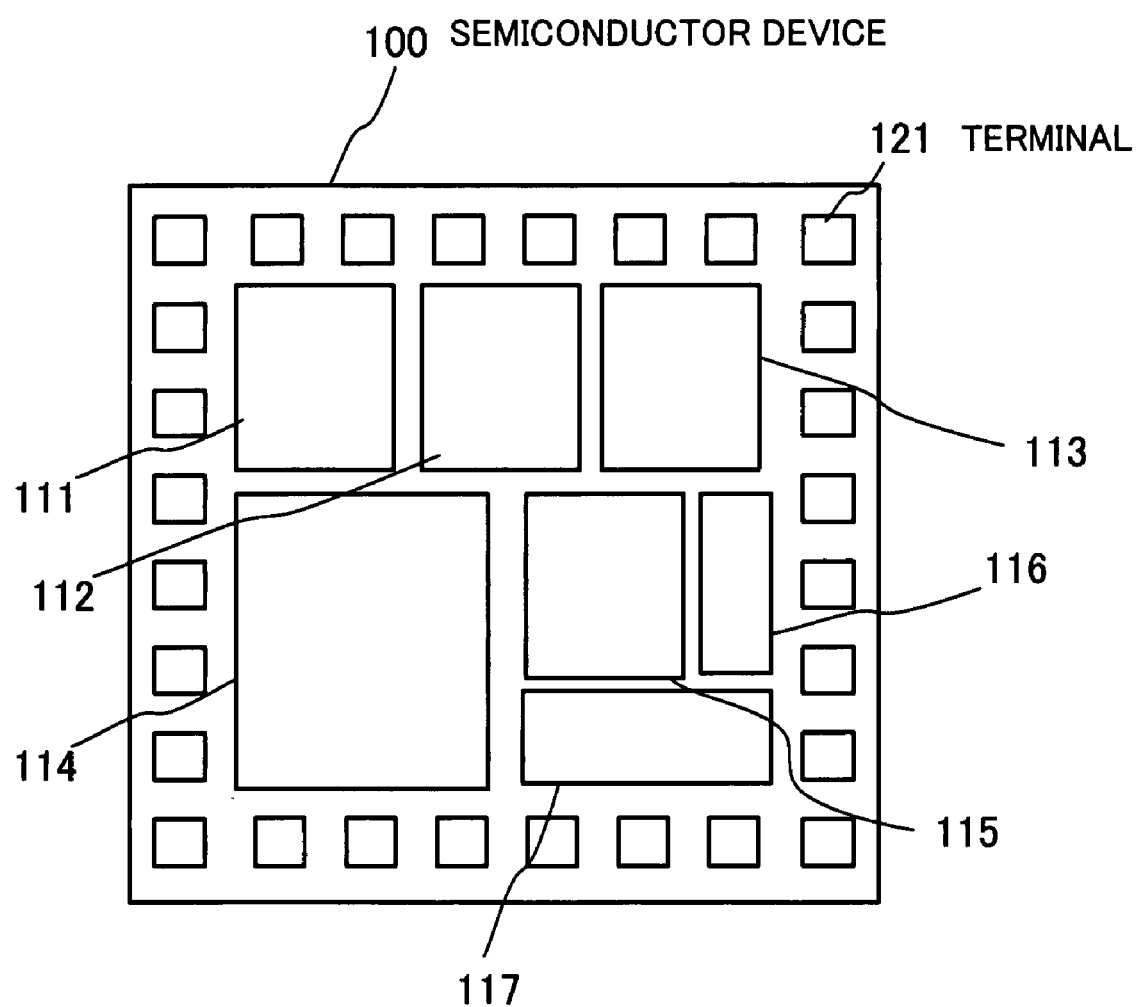
FIG. 7 is a view showing the structure of a semiconductor device to which the ESD protection circuits according to the embodiments of the present invention are applied.

The above-mentioned ESD protection circuits are applied to semiconductor devices including a plurality of circuit blocks to which electric power is supplied from different power supplies. FIG. 7 is a view showing the structure of a semiconductor device to which the ESD protection circuits according to the embodiments are applied.

A semiconductor device 100 includes circuit blocks 111, 112, 113, 114, 115, 116, and 117 which belongs to different power supply systems. Terminals 121 are located around the circuit blocks 111, 112, 113, 114, 115, 116, and 117. If a fixed output signal connected to a power supply line or a grounding line of a first circuit block is outputted to a second circuit block among the circuit blocks 111, 112, 113, 114, 115, 116, and 117, then the above-mentioned ESD protection circuit including the clamp circuits located in the two circuit blocks and the protection circuit located on the signal line via which the fixed output signal is sent is located. As a result, the ESD protection circuit which is effective both against ESDs simulated by the MM and the HBM and against an ESD simulated by the CDM is included in the semiconductor device 100, though the ESDs simulated by the MM and the HBM and the ESD simulated by the CDM have different characteristics.

By the way, usually an ESD protection circuit included in a semiconductor device is made by the use of a design support system in which a computer aided design (CAD) program is executed by a computer. When such a design support system is used for preparing a circuit design for circuit blocks included in a semiconductor device, an ESD protection circuit is set as occasion arises.

As described above, overvoltage which reaches a high peak value in a short period of time and which is simulated by the CDM has a bad influence especially in the case of a control signal sent from one circuit block to another circuit block via a signal line being a fixed output signal connected to a power supply line or a grounding line. Accordingly, when a program for making the ESD protection circuits performs the process of making the ESD protection circuits, the program detects such a place and inserts the protection circuit 14 shown in FIG. 1.

Figure 8:
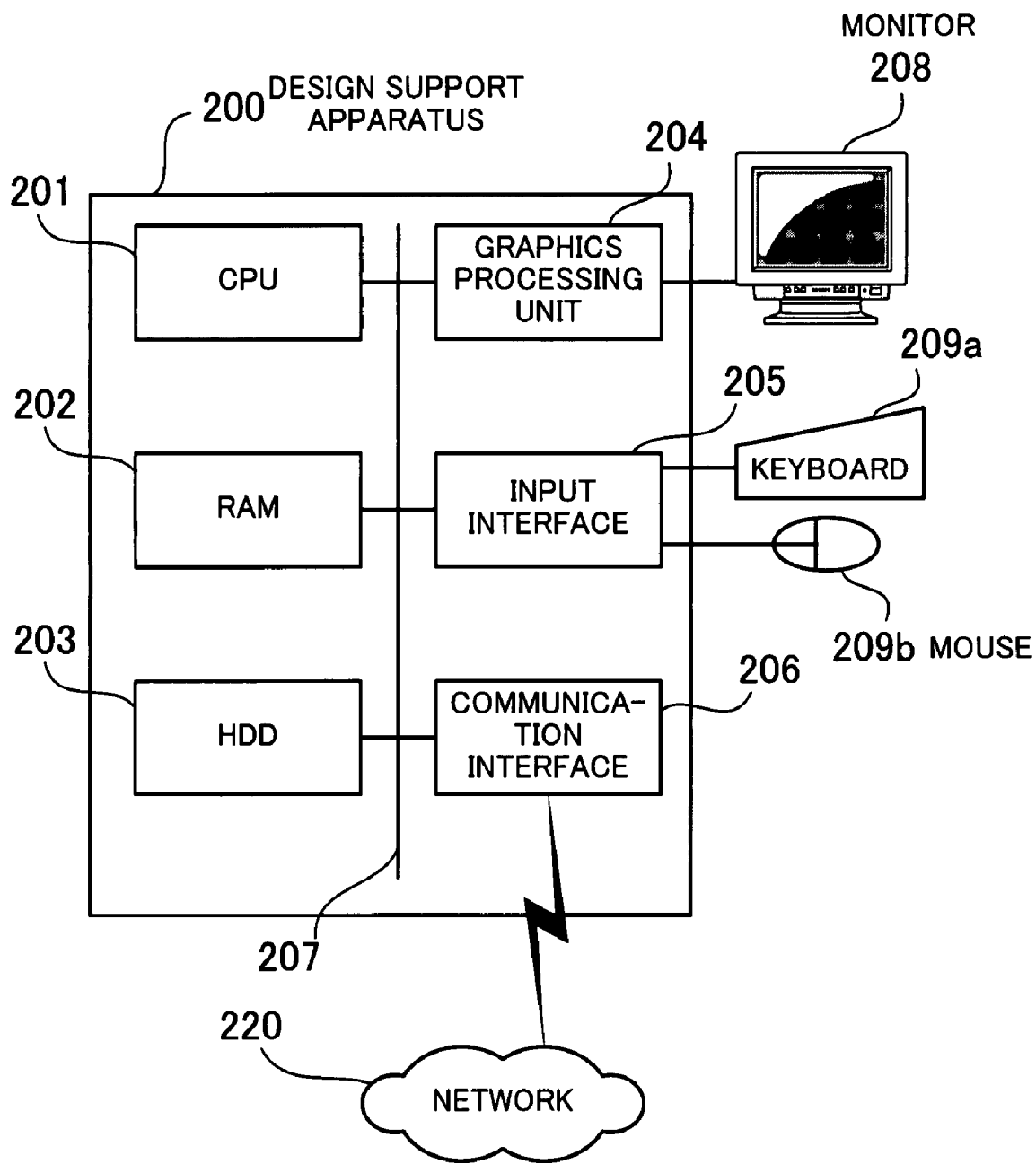
FIG. 8 is a block diagram showing an example of the hardware configuration of a design support apparatus.

The hardware configuration of a design support apparatus which executes the CAD program will now be described. FIG. 8 is a block diagram showing an example of the hardware configuration of a design support apparatus.

The whole of a design support apparatus 200 is controlled by a central processing unit (CPU) 201. A random access memory (RAM) 202, a hard disk drive (HDD) 203, a graphics processing unit 204, an input interface 205, and a communication interface 206 are connected to the CPU 201 via a bus 207.

The RAM 202 temporarily stores at least part of an operating system (OS) or an application program executed by the CPU 201. The RAM 202 also stores various pieces of data which the CPU 201 needs to perform a process. The HDD 203 stores the OS and application programs. A monitor 208 is connected to the graphics processing unit 204. In accordance with instructions from the CPU 201, the graphics processing unit 204 displays an image on a screen of the monitor 208. A keyboard 209a and a mouse 209b are connected to the input interface 205. The input interface 205 sends a signal sent from the keyboard 209a or the mouse 209b to the CPU 201 via the bus 207. The communication interface 206 is connected to a network 220. The communication interface 206 exchanges data with a terminal unit via the network 220.

By adopting such a hardware configuration, the processing function of making the ESD protection circuits can be realized.

Figure 9:
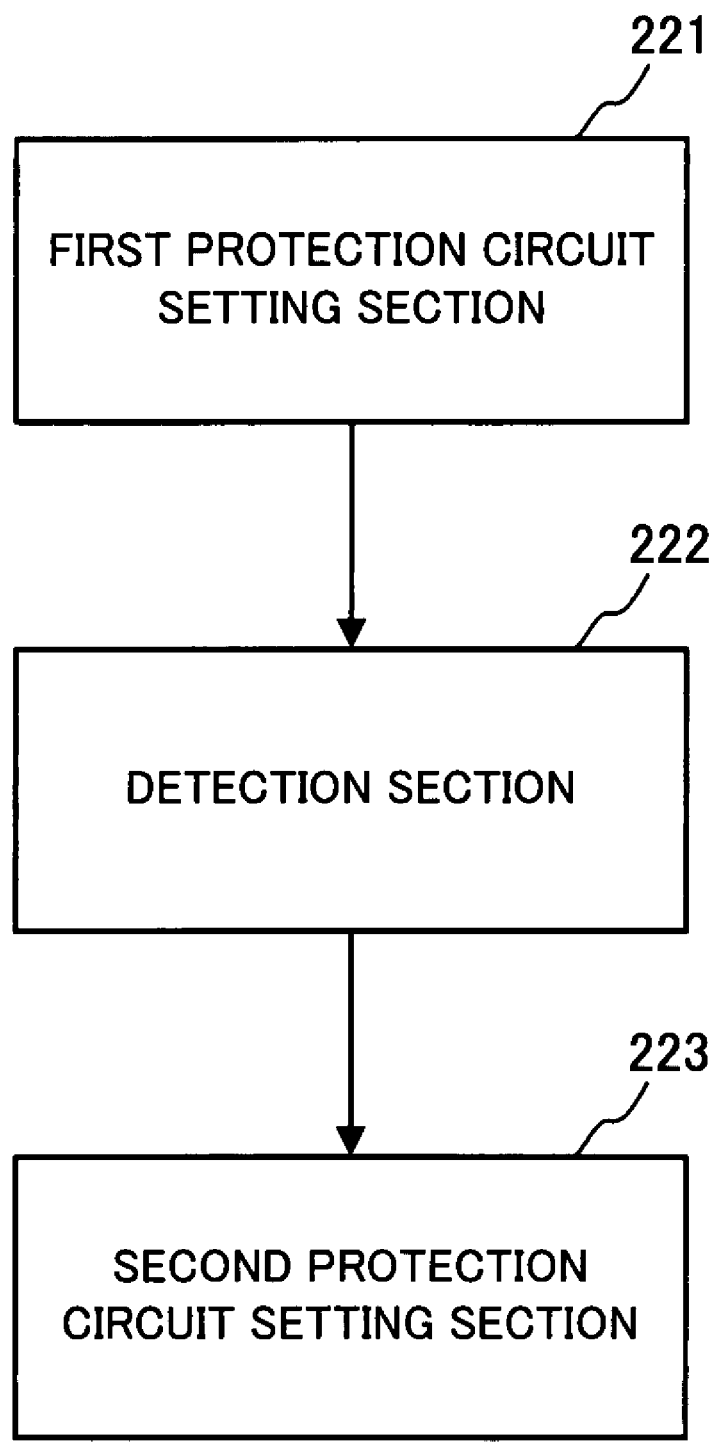
FIG. 9 is a block diagram showing the processing function of making the ESD protection circuits according to the embodiments of the present invention performed by the design support apparatus.
Figure 10:
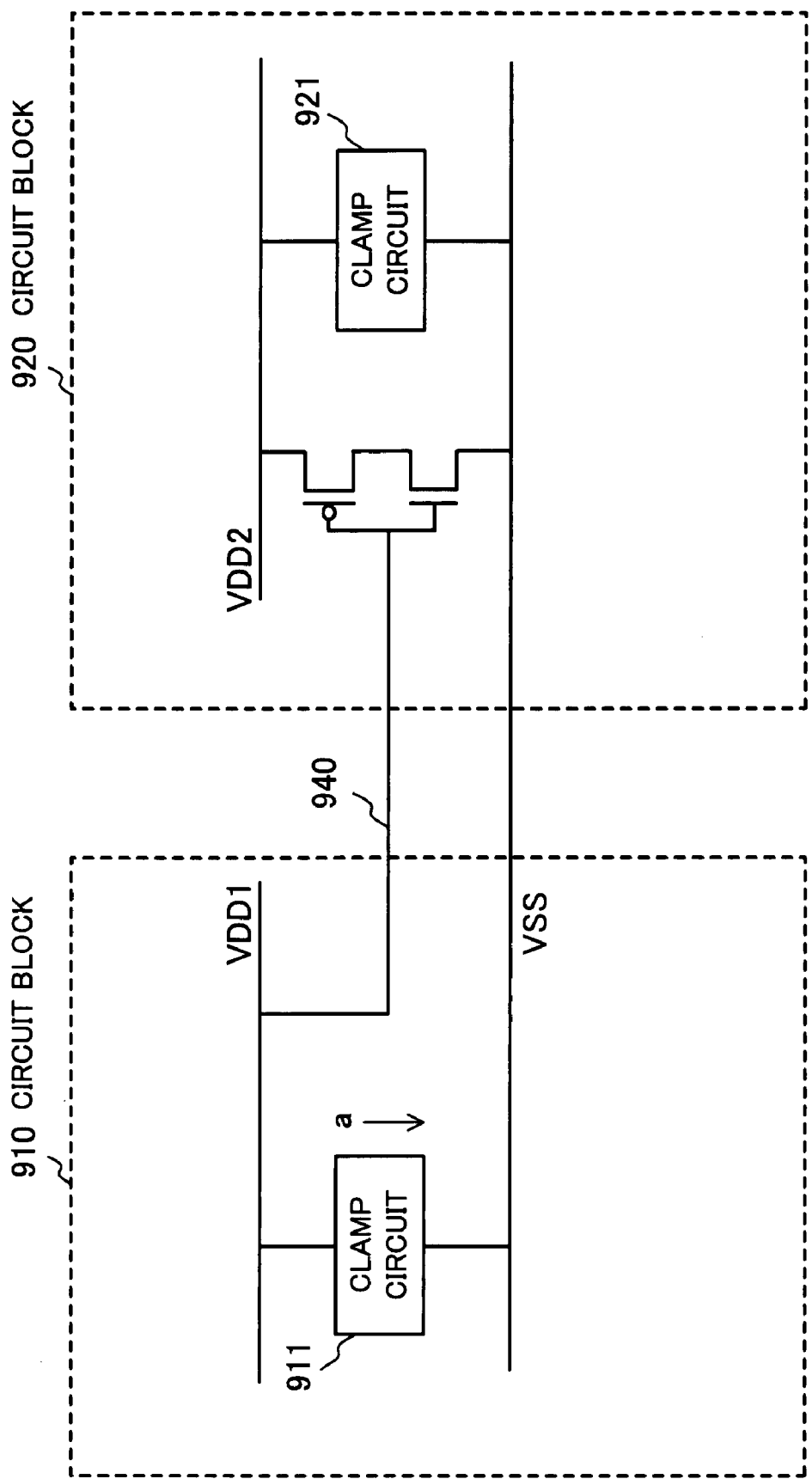
FIG. 10 is a circuit diagram showing an example of an ESD protection circuit included in a conventional semiconductor device.
Figure 11A:
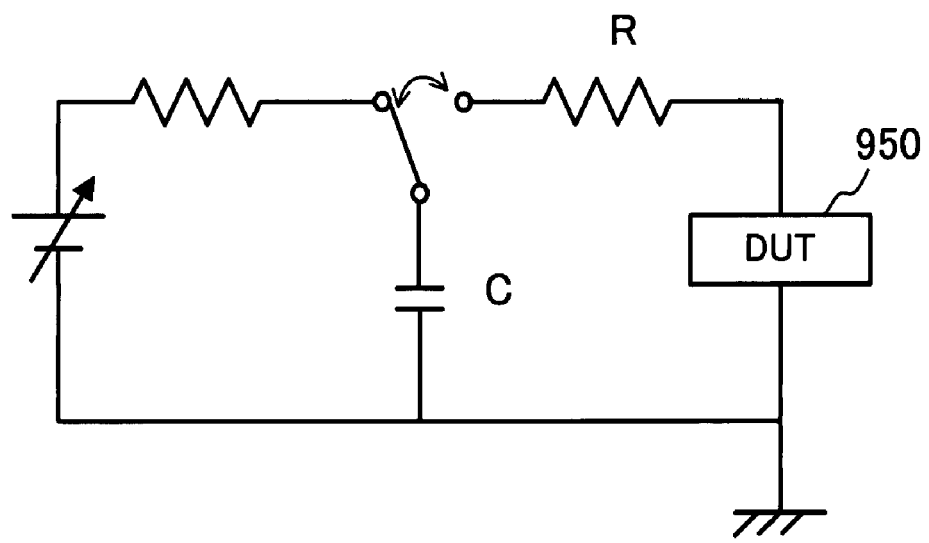
FIGS. 11A and 11B are views showing the rough structure of the test circuits which simulate the electrostatic discharge failure models.
Figure 11B:
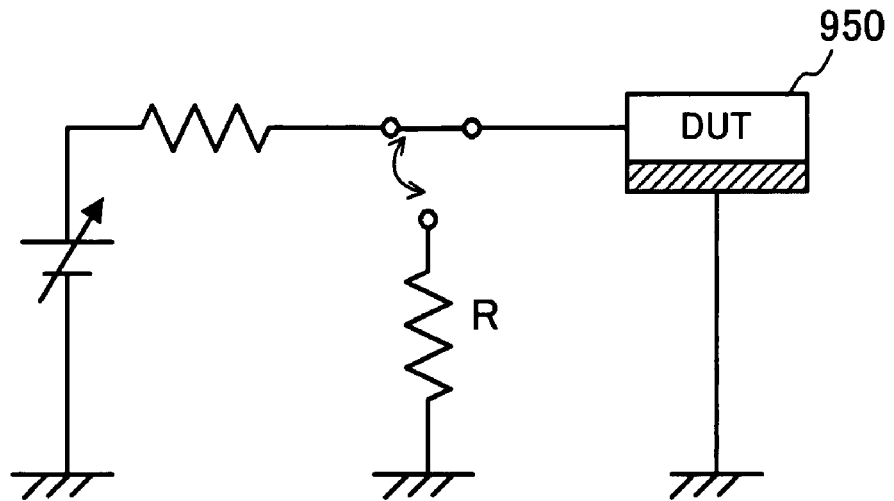

FIG. 9 is a block diagram showing the processing function of making the ESD protection circuits performed by the design support apparatus.

The process of making the ESD protection circuits according to the embodiments is performed by a first protection circuit setting section 221, a detection section 222, and a second protection circuit setting section 223.

The first protection circuit setting section 221 locates a first protection circuit including a clamp circuit for clamping overvoltage by forming an electric current path and by making an electric charge generated by the overvoltage flow to a grounding line at the time of the overvoltage being applied to a power supply line between the power supply line and the grounding line of a circuit block designated.

The detection section 222 checks a signal line via which a predetermined control signal is sent to or from the circuit block in which the first protection circuit is set. The detection section 222 retrieves a signal line which is connected to a power supply line or a grounding line of an output-side circuit block and which is connected directly to a transistor element of an input-side circuit block. That is to say, the detection section 222 detects a signal line via which a fixed output signal having power supply potential or ground potential is directly sent from an output-side circuit block to an input-side circuit block as a control signal. The detection section 222 informs the second protection circuit setting section 223 of information regarding circuit blocks between which the signal line is detected.

The second protection circuit setting section 223 locates a second protection circuit for suppressing an increase in signal level caused by overvoltage due to an electrostatic discharge added to the signal sent via the signal line on the signal line detected by the detection section 222.

With the above design support apparatus the first protection circuit setting section 221 locates the first protection circuit including the clamp circuit in each of the circuit blocks which belong to different power supply systems. The detection section 222 then retrieves circuit blocks in each of which the first protection circuit is located, and detects a signal line by which a power supply line or a grounding line of an output-side circuit block and an input-side circuit block directly connect. If the detection section 222 detects a signal line which meets this condition, then the second protection circuit setting section 223 locates the second protection circuit on this signal line.

As a result, the ESD protection circuit that protects an internal circuit not only against ESDs simulated by the MM and the HBM but also against overvoltage which is applied in a very short period of time and which is simulated by the CDM can automatically be made.

Operational functions, such as performing the above-mentioned processes individually, are based on the CAD program to which a program used for making the ESD protection circuits belongs.

The above processing function can be realized with a computer. In this case, a program in which the contents of the process of supporting the making of the ESD protection circuit are described is provided. By executing this program on the computer, the above functions are realized on the computer. This program can be recorded on a computer readable record medium. A computer readable record medium can be a magnetic recording device, an optical disk, a magneto-optical recording medium, a semiconductor memory, or the like. A magnetic recording device can be a hard disk drive (HDD), a flexible disk (FD), a magnetic tape, or the like. An optical disk can be a digital versatile disk (DVD), a digital versatile disk random access memory (DVD-RAM), a compact disk read only memory (CD-ROM), a compact disk recordable (CD-R)/rewritable (CD-RW), or the like. A magneto-optical recording medium can be a magneto-optical disk (MO) or the like.

To place the program on the market, portable record media, such as DVDs or CD-ROMs, on which it is recorded are sold. Alternatively, the program is stored in advance on a hard disk in a server computer and is transferred from the server computer to another computer via a network.

When the computer executes this program, it will store the program, which is recorded on a portable record medium or which is transferred from the server computer, on, for example, its hard disk. Then the computer reads the program from its hard disk and performs processes in compliance with the program. The computer can also read the program directly from a portable record medium and perform processes in compliance with the program. Furthermore, each time the program is transferred from the server computer, the computer can perform processes in turn in compliance with the program it receives.

With the ESD protection circuit, in the case of overvoltage generated due to an ESD or the like being generated in each of different power supply systems to which circuit blocks belong, a significant change in the level of a signal sent between the circuit blocks via a signal line by which the circuit blocks are connected can be suppressed by the protection circuit located on the signal line. This prevents the application of the overvoltage to an input transistor included in a circuit block which is connected to the signal line and which receives the signal. Accordingly, the breakdown of the input transistor can be prevented.

The foregoing is considered as illustrative only of the principles. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor device, comprising:
    a first circuit block provided between a first power supply line and a second power supply line, a first power supply voltage supplied from the first power supply line being higher than a second power supply voltage supplied from the second power supply line; and
    a second circuit block provided between the second power supply line and a third power supply line, a third power supply voltage supplied from the third power supply line being different from the first power supply voltage,
    wherein the second circuit block includes:
        a second clamp circuit to clamp an overvoltage by forming an electric current path between the second power supply line and the third power supply line; and
        a circuit provided between the second power supply voltage line and the third power supply voltage line,
    wherein the first circuit block includes:
        a first clamp circuit to clamp the overvoltage by forming an electric current path between the first power supply line and the second power supply line; and
        a first protection circuit that is located on a signal line through which a predetermined signal is sent from the first power supply line to the circuit in the second circuit block,
        wherein the first protection circuit includes a buffer circuit, an input of which being coupled to the first power supply line.

2. The semiconductor device according to claim 1, wherein the first protection circuit reduces a change in a signal level of the signal line caused by an electrostatic discharge generated by a electric charge flow.

3. The semiconductor device according to claim 1, wherein the first protection circuit reduces a signal level of the signal line which is increased by the overvoltage generated due to the electrostatic discharge.

4. The electrostatic discharge protection circuit according to claim 1, wherein the clamp circuit clamps the overvoltage by forming an electric current path when the overvoltage is applied to the first power supply line in one of circuit blocks which belong to different power supply systems.

5. The electrostatic discharge protection circuit according to claim 1, wherein the second power supply line is a ground line.

* * * * *